United States Patent
Lue

(10) Patent No.: US 9,922,989 B2
(45) Date of Patent: Mar. 20, 2018

(54) MEMORY DEVICE HAVING INTERCHANGEABLE GATE/CHANNEL TRANSISTOR AND MANUFACTURING METHOD OF THE SAME

(71) Applicant: MACRONIX INTERNATIONAL CO., LTD., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/290,179

(22) Filed: Oct. 11, 2016

(65) Prior Publication Data

US 2018/0053772 A1    Feb. 22, 2018

(30) Foreign Application Priority Data

Aug. 22, 2016    (TW) .............................. 105126701 A

(51) Int. Cl.
| | | |
|---|---|---|
| H01L 27/115 | (2017.01) | |
| H01L 27/1157 | (2017.01) | |
| H01L 27/11565 | (2017.01) | |
| H01L 27/11582 | (2017.01) | |
| H01L 21/28 | (2006.01) | |

(52) U.S. Cl.
CPC .... H01L 27/1157 (2013.01); H01L 21/28273 (2013.01); H01L 27/11565 (2013.01); H01L 27/11582 (2013.01)

(58) Field of Classification Search
CPC ......... H01L 27/11524; H01L 27/11529; H01L 27/11582; H01L 27/11578; H01L 27/1157; H01L 27/11565; H01L 29/7926
USPC ....... 257/314–326, E27.078, E29.3–E29.309
See application file for complete search history.

(56) References Cited

U.S. PATENT DOCUMENTS

| | | | | |
|---|---|---|---|---|
| 2010/0140685 | A1* | 6/2010 | Kang .................... | H01L 27/115 257/324 |
| 2013/0119455 | A1* | 5/2013 | Chen ................... | H01L 27/1157 257/324 |
| 2014/0231954 | A1* | 8/2014 | Lue ................... | H01L 27/11524 257/528 |

* cited by examiner

*Primary Examiner* — Jonathan Han
(74) *Attorney, Agent, or Firm* — McClure, Qualey & Rodack, LLP

(57) ABSTRACT

A memory device is provided. The memory device includes a bottom conductive line, a stacked structure, a side oxide layer, a dielectric layer and a side semiconductor layer. The stacked structure is disposed on the bottom conductive line, and includes a first semiconductor layer, a second semiconductor layer disposed above the first semiconductor layer, and a plurality of oxide layers alternately stacked with the first semiconductor layer and the second semiconductor layer. The side oxide layer is disposed on both side walls of the first conductive layer. The dielectric layer is disposed on the stacked structure. The side semiconductor layer is disposed on the dielectric layer.

13 Claims, 11 Drawing Sheets

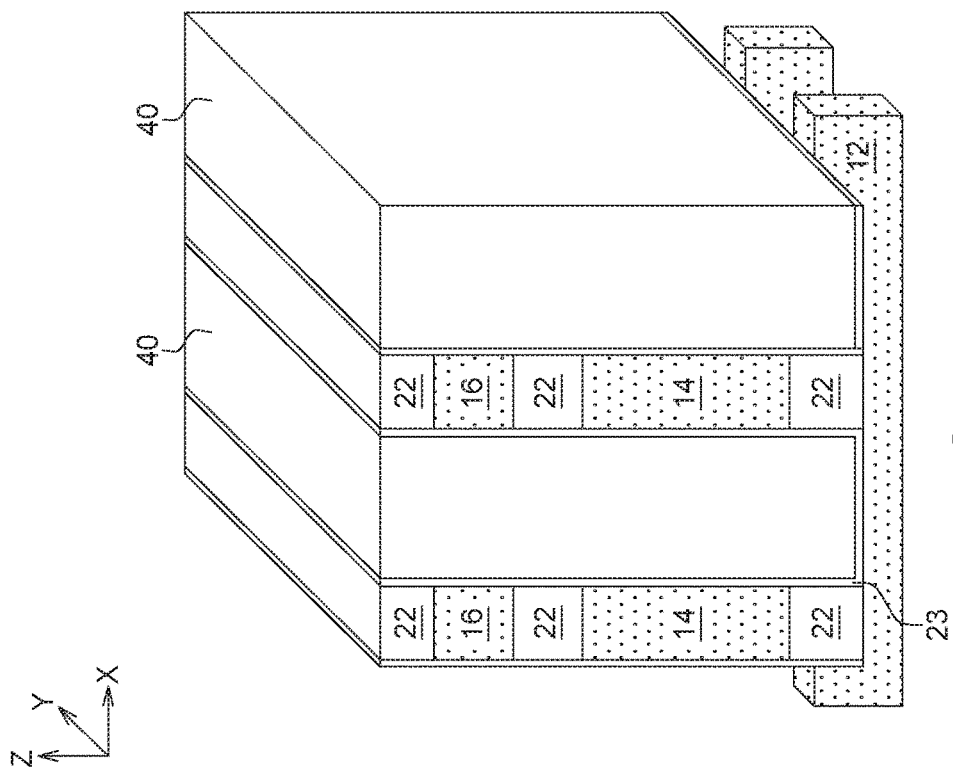
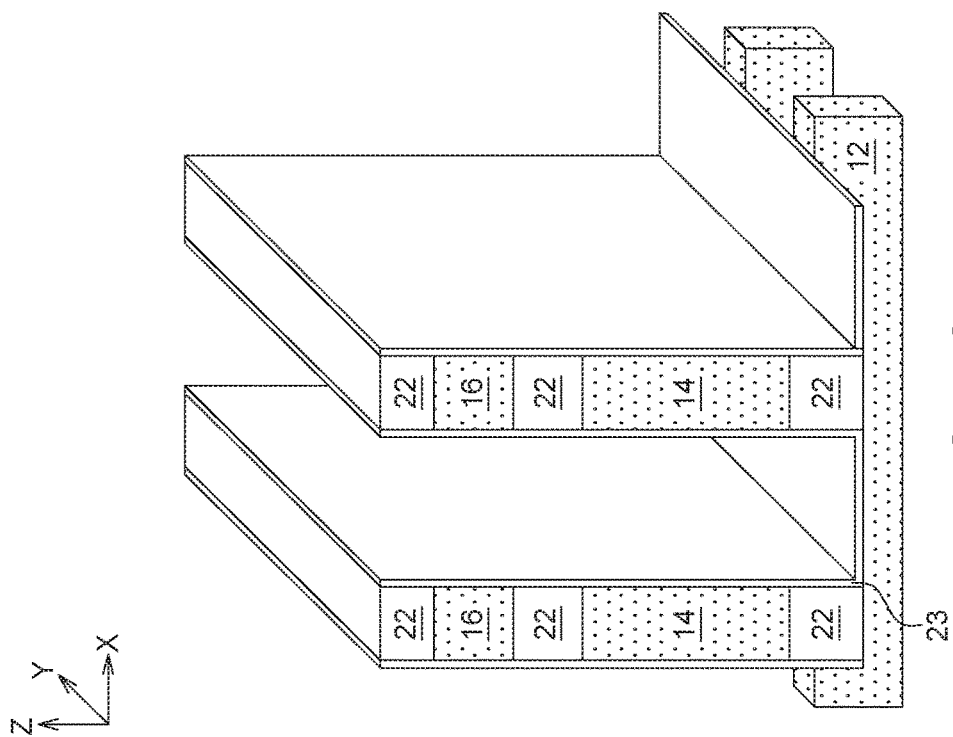

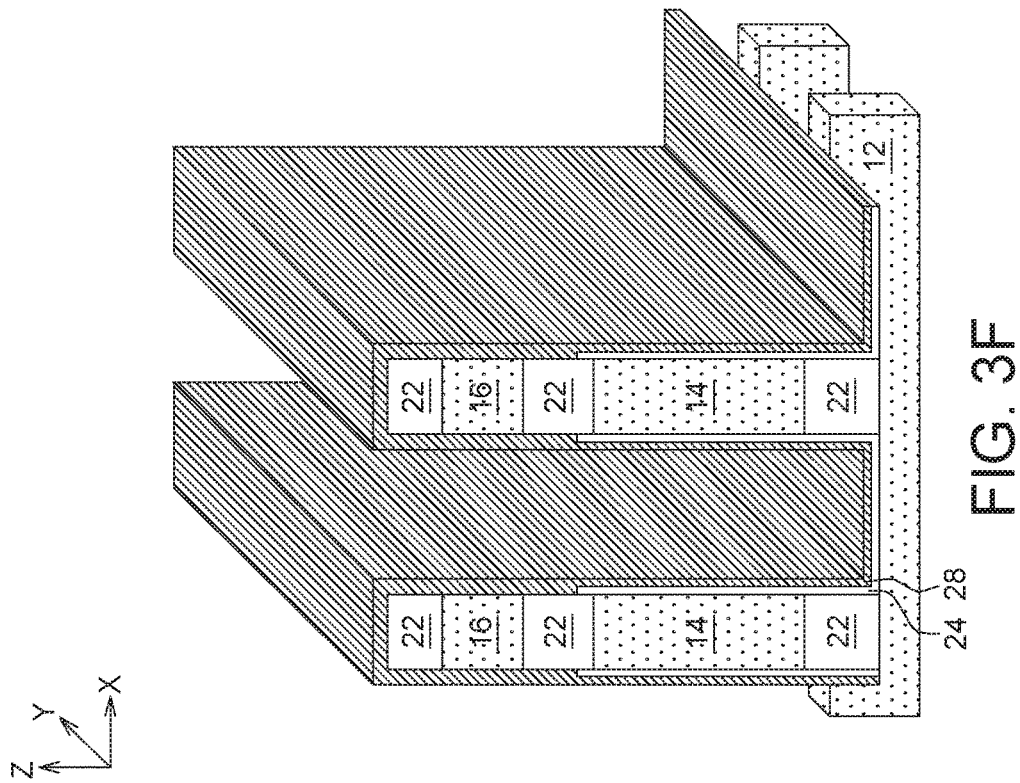
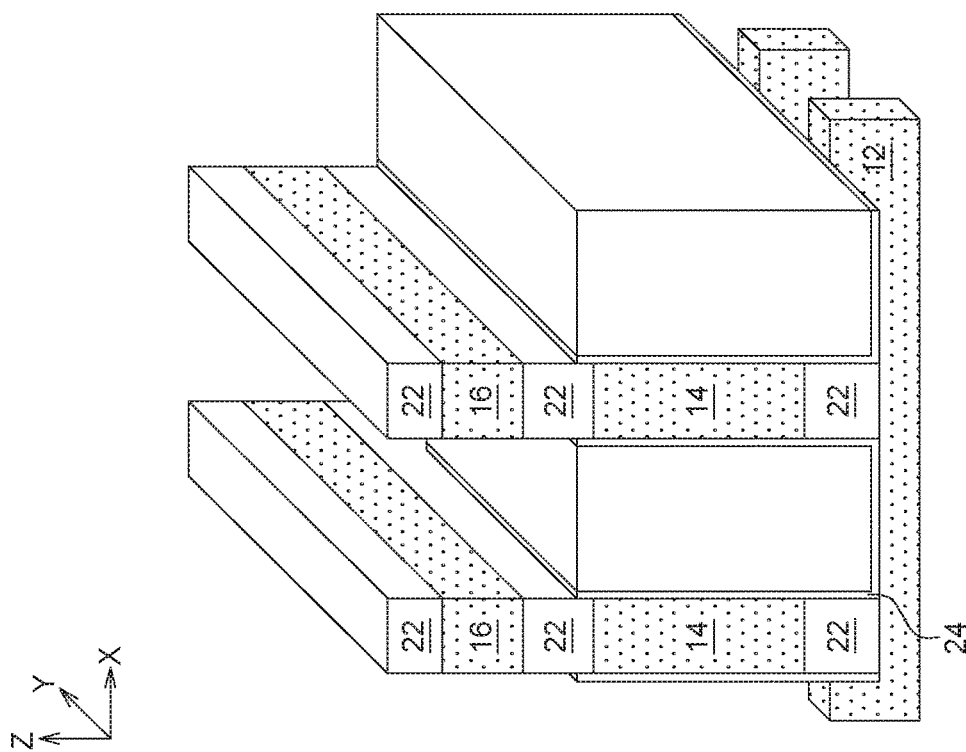

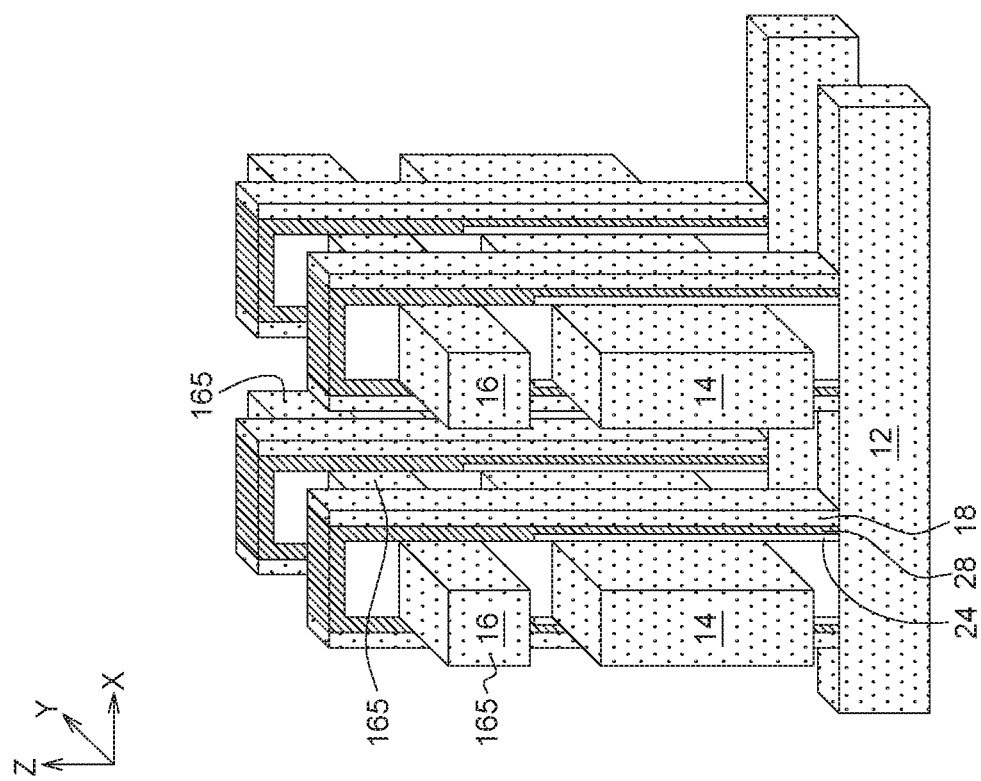
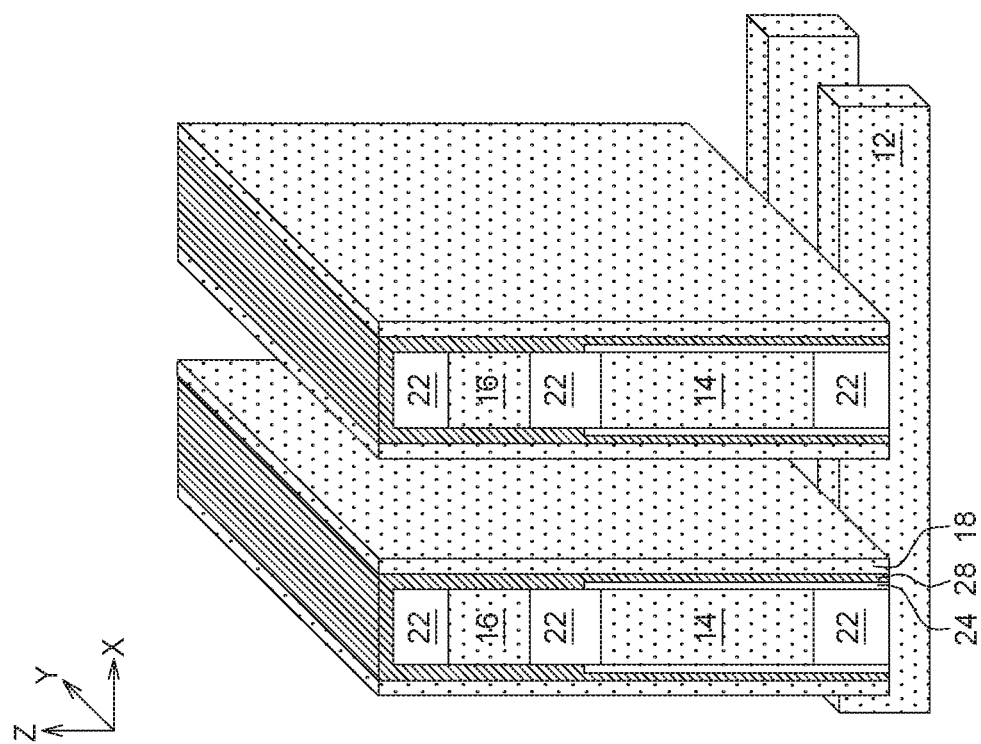

US 9,922,989 B2

MEMORY DEVICE HAVING INTERCHANGEABLE GATE/CHANNEL TRANSISTOR AND MANUFACTURING METHOD OF THE SAME

This application claims the benefit of Taiwan application Serial No. 105126701, filed Aug. 22, 2016, the subject matter of which is incorporated herein by reference.

TECHNICAL FIELD

The disclosure relates in general to a memory device and a manufacturing method of the same, and more particularly to a memory device having an interchangeable gate/channel transistor and a manufacturing method of the same.

BACKGROUND

Electrically-erasable programmable read-only Memory (EEPROM) possesses random-bit operations and is ideal in some applications. However, EEPROM is not scalable because of the large two-transistor (2T) design and large operation voltages. Thus, EEPROM has evolved into flash structure historically, where one-transistor (1T) array with block erase method enables device scaling.

However, block erase method of 1T flash architecture abandons the random access feature of EEPROM. For NAND Flash, the serial connected to NAND string inevitably makes the read current very small (<500 nA), leading to slow read speed.

Ideally, if flash (charge-storage) device can be designed with random access write/erase, and fast read speed, together with high scalability and 3D stackability, then such a 3D EEPROM device is probably even more competitive than emerging memory devices such as PCRAM and ReRAM.

SUMMARY

The disclosure is directed to a memory device and a manufacturing method of the same, which are a novel 3D EEPROM array that provides scalability as well as 3D stackability and the manufacturing method of the same. The concept is enabled by a novel interchangeable gate/channel 3D transistor.

According to one aspect of the disclosure, a memory device is provided. The memory device includes a bottom conductive line, a stacked structure, a side oxide layer, a dielectric layer and a side semiconductor layer. The stacked structure is disposed on the bottom conductive line, and includes a first semiconductor layer, a second semiconductor layer disposed above the first semiconductor layer, and a plurality of oxide layers alternately stacked with the first semiconductor layer and the second semiconductor layer. The side oxide layer is disposed on both side walls of the first conductive layer. The dielectric layer is disposed on the stacked structure. The side semiconductor layer is disposed on the dielectric layer.

According to another aspect of the disclosure, a manufacturing method of a memory device is provided. The method includes the following steps. A plurality of bottom conductive lines is formed. A plurality of semiconductor layers and oxide layers is alternately stacked on the conductive lines. The plurality of semiconductor layers and oxide layers is etched to form a plurality of stacked structures. Each of the stacked structures includes a first semiconductor layer and a second semiconductor layer disposed above the first semiconductor layer. A side oxide layer is formed on both side walls of the first conductive layer. A dielectric layer is formed on the stacked structures. A side semiconductor layer is formed on the dielectric layer.

BRIEF DESCRIPTION OF THE DRAWINGS

FIG. 3A to FIG. 3I illustrate a process for manufacturing the memory device in one embodiment according to the disclosure.

Figure 1A:
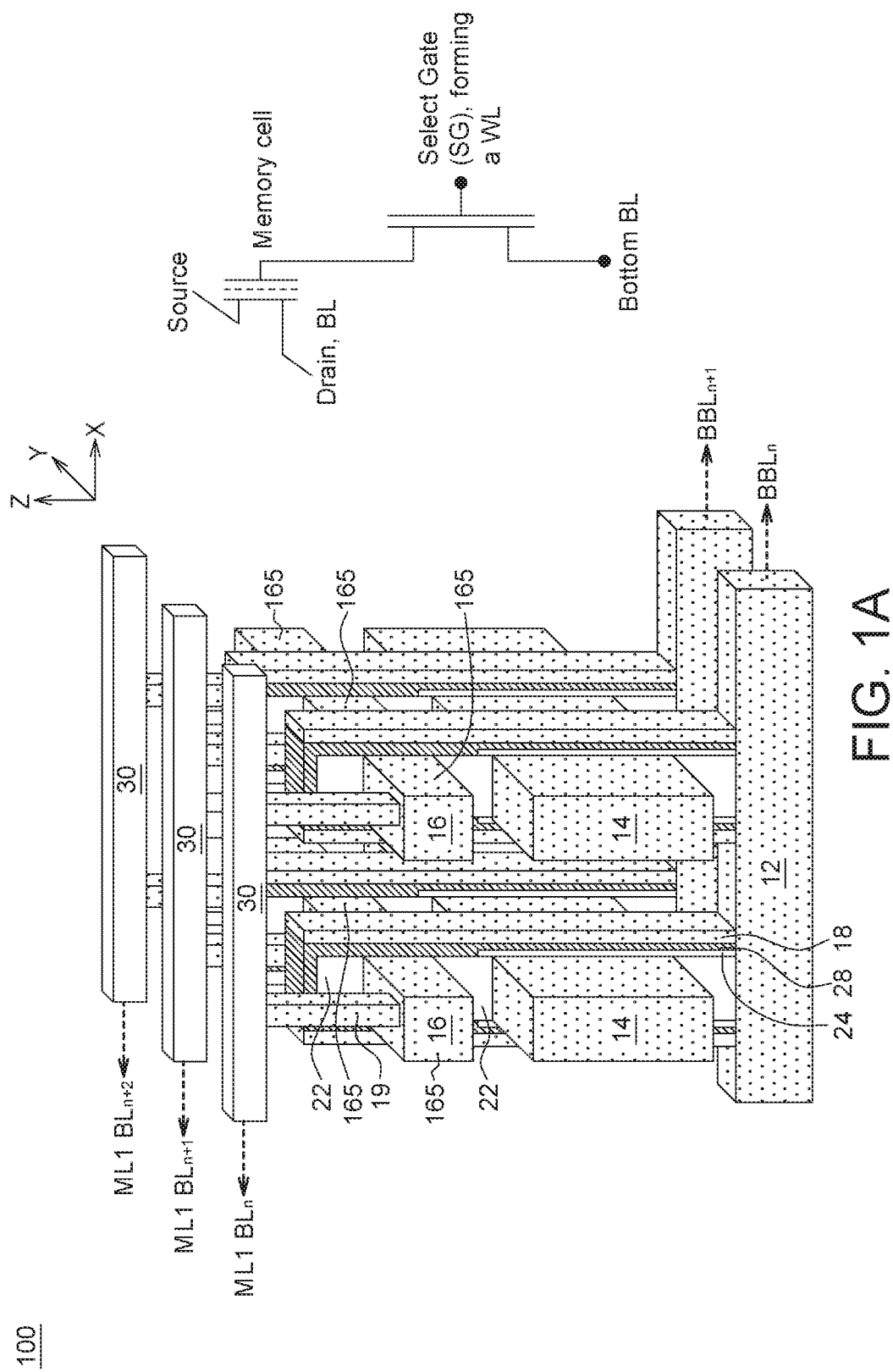
FIG. 1A illustrates a 3D architecture and an equivalent circuit diagram of a memory device in one embodiment according to the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in details with reference to the accompanying drawings. The identical elements of the embodiments are designated with the same reference numerals. Also, it is important to point out that the illustrations may not be necessarily drawn to scale, and there may be other embodiments of the present disclosure which are not specifically illustrated. Thus, the specification and the drawings are regarded as an illustrative sense rather than a restrictive sense.

Figure 1B:
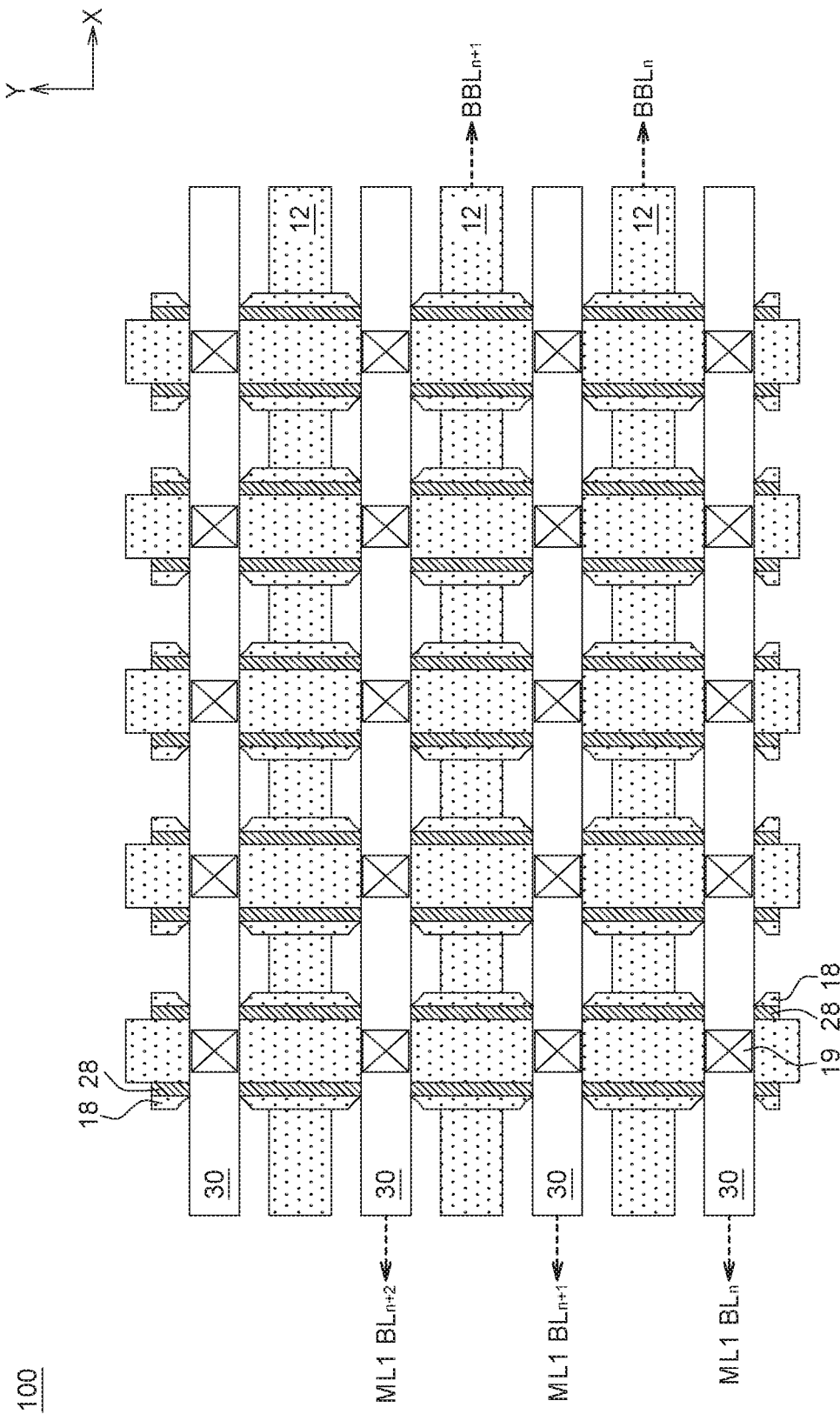
FIG. 1B illustrates a top view of the semiconductor structure in one embodiment according to the disclosure.

FIG. 1A illustrates a 3D architecture and an equivalent circuit diagram of a memory device 100 in one embodiment according to the disclosure. FIG. 1B illustrates a top view of the semiconductor structure 100 in one embodiment according to the disclosure. It should be noted that some elements may be omitted in the following figures for illustrating the relationship between other elements more clearly. For example, portions of oxide layers 22 are omitted in FIG. 1A.

As shown in FIG. 1A and FIG. 1B, the memory device 100 may include bottom conductive lines 12 (e.g. $BBL_n$ and $BBL_{n+1}$), stacked structures disposed on the bottom conductive lines 12. In FIG. 1A, two stacked structures are disposed on two bottom conductive lines 12. However, the number of the stacked structures and the number of the bottom conductive lines 12 are not limited as illustrated in FIG. 1A.

In one embodiment, each of the stacked structures includes a first semiconductor layer 14, a second semiconductor layer 16 disposed above the first semiconductor layer 14, and a plurality of oxide layers 22 alternately stacked with the first semiconductor layer 14 and the second semiconductor layer 16.

Further, the memory device 100 may further include a side oxide layer 24 disposed on both side walls of the first conductive layer 14, a dielectric layer 28 disposed on the stacked structures, a side semiconductor layer 18 disposed on the dielectric layer 28, a plurality of contacts 19 electrically connected to the second semiconductor layer 16, and a top conductive line 30 electrically connected to one of the contacts 19.

In this embodiment, the top conductive line 30 may be disposed parallel with the bottom conductive line 12, and the top conductive line 30 may be formed of metal, while the bottom conductive line 12 may be formed of polysilicon. For example, the bottom conductive line 12 may be a bottom bit line (BBL) such as $BBL_n$, $BBL_{n+1}$; the top conductive line 30 may be a top bit line (ML1 BL) such as ML1 $BL_n$, ML1 $BL_{n+1}$, ML1 $BL_{n+2}$.

Here, the first semiconductor layer 14, the side oxide layer 24, the dielectric layer 28, and the side semiconductor layer 18 may define a bottom select-gate (SG) transistor (VC cell); the second semiconductor layer 16, the dielectric layer 28, and the side semiconductor layer 18 may define a top memory cell (VG cell). Further, first semiconductor layer 14 may form the word line (WL) (select gate) of the bottom select-gate transistor, while the second semiconductor layer 16 may form source/drain portions 165 of the top memory cell, and the contacts 19 may be directly in contact with the source/drain portions 165.

In this embodiment, the conductive type of the bottom conductive lines 12 may be different from the conductive type of the first semiconductor layer 14. For example, the bottom conductive lines 12 may be formed of N-type polysilicon, while the first semiconductor layer 14 may be formed of P-type polysilicon.

Further, the second semiconductor layer 16 and the side semiconductor layer 18 may be formed of undoped polysilicon. In this embodiment, the side semiconductor layer 18 may be connected to the bottom conductive lines 12.

In one embodiment, the dielectric layer 28 of the memory device 100 may be a multi-layer structure. For example, the dielectric layer 28 may be an ONO structure. In some embodiments, a thickness of the side oxide layer 24 may be about 10 nm.

Hence, the top memory cell (VG cell) may have double gate, and be a SONOS-type charge-trapping device, which can be used to store electrons/holes for memory states; the bottom select-gate transistor (VC cell) may have a thicker gate oxide (GOX) formed of the side oxide layer 24 and the dielectric layer 28 (thin film combination) to sustain high voltages during operations without $V_t$ shift.

In this embodiment, the side semiconductor layer 18 may serve as a vertical channel (VC) of the bottom select-gate transistor, but serve as the effective vertical gate (VG) of the top memory cell. That is, the memory device 100 may consist of two transistors—the top is the VG cell with horizontal channel; while the bottom is the VC cell with vertical channel. Further, the bottom select-gate transistor is a long-channel (>0.6 μm) device to sustain the high-voltages.

Figure 2A:
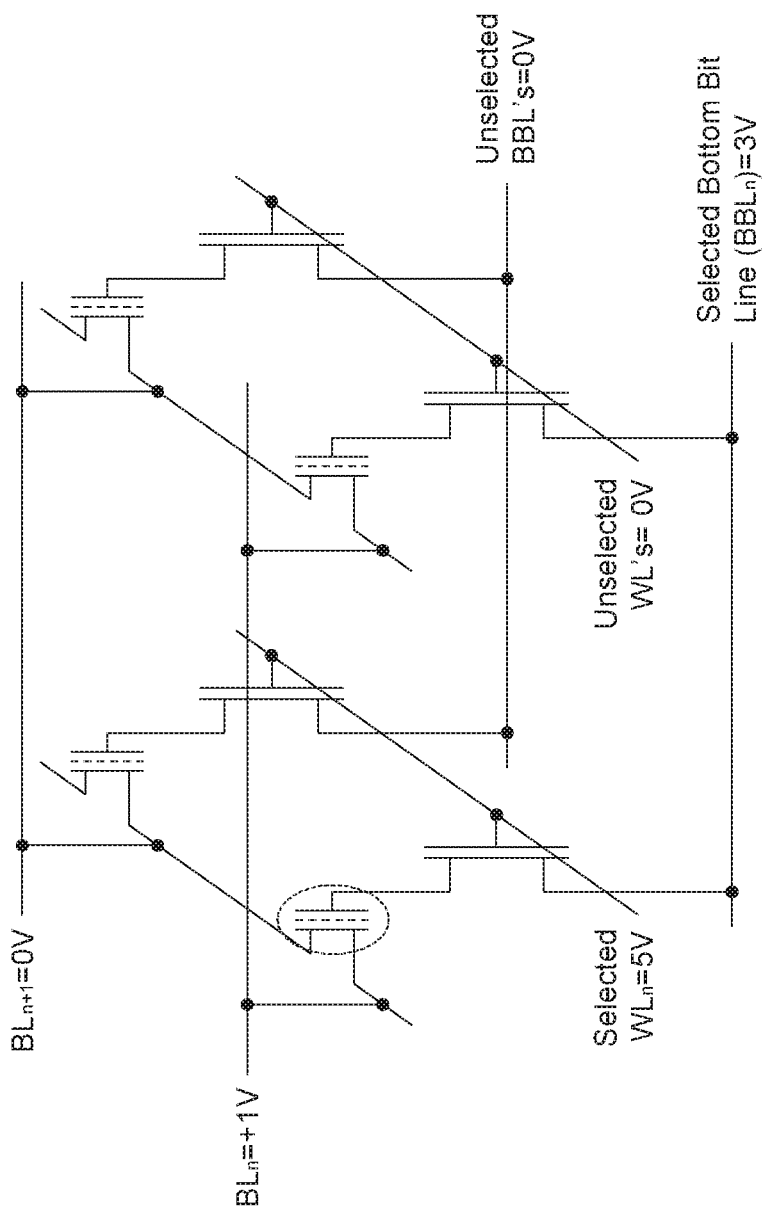
FIG. 2A illustrates the equivalent circuit diagram of the memory device during the read operation.
Figure 2B:
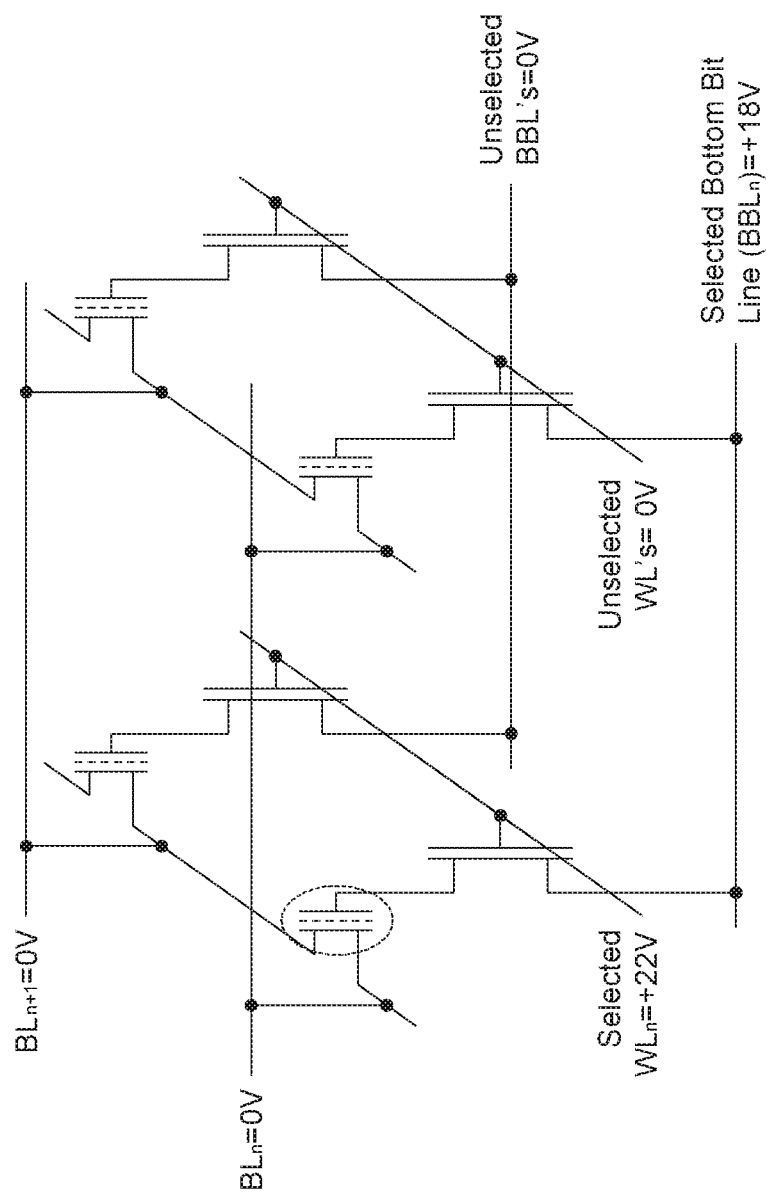
FIG. 2B illustrates the equivalent circuit diagram of the memory device during the program operation.

FIG. 2A illustrates the equivalent circuit diagram of the memory device 100 during the read operation. FIG. 2B illustrates the equivalent circuit diagram of the memory device 100 during the program operation. FIG. 2O illustrates the equivalent circuit diagram of the memory device 100 during the erase operation.

As shown in FIG. 2A, to select a memory cell (enclosed by the dotted line in FIG. 2A) for read, the corresponding word line (select gate) and bottom bit line in a cross-point manner may be selected. Thus only the selected cell has a sufficient potential ($V_{ref}$~3V, which is defined as the reference voltage in between program and erase state $V_t$) for the side semiconductor layer 18, which acts as the effective gate voltage of the top VG cell. Read current is read out by the two adjacent top conductive lines (ML1 $BL_n$, and ML1 $BL_{n+1}$), arranged in a virtual-ground NOR-type array for the top VG memory cell.

Because the memory cell is in a virtual ground array where each single memory cell is read out directly, the read current is forecasted to be 10~20 μA. This can fulfill NOR-type flash sensing speed of <100 nsec latency ($T_{read}$<100 nsec).

As shown in FIG. 2B, to select a memory cell (enclosed by the dotted line in FIG. 2B) for program, the voltages of the corresponding two adjacent top conductive lines (ML1 $BL_n$, and ML1 $BL_{n+1}$) are 0V, and the voltages of the other top conductive lines are floated. The voltage of the corresponding word line (select gate) may be +22V, while voltage of the corresponding bottom conductive line ($BBL_n$) may be +18V for +FN programming. For the selected cell, the common double-gate (thin channel of bottom VC cell) are +18V accordingly, resulting in the +FN programming for the top VG cell. In this embodiment, the program time may be less than 300 nsec.

Figure 2C:
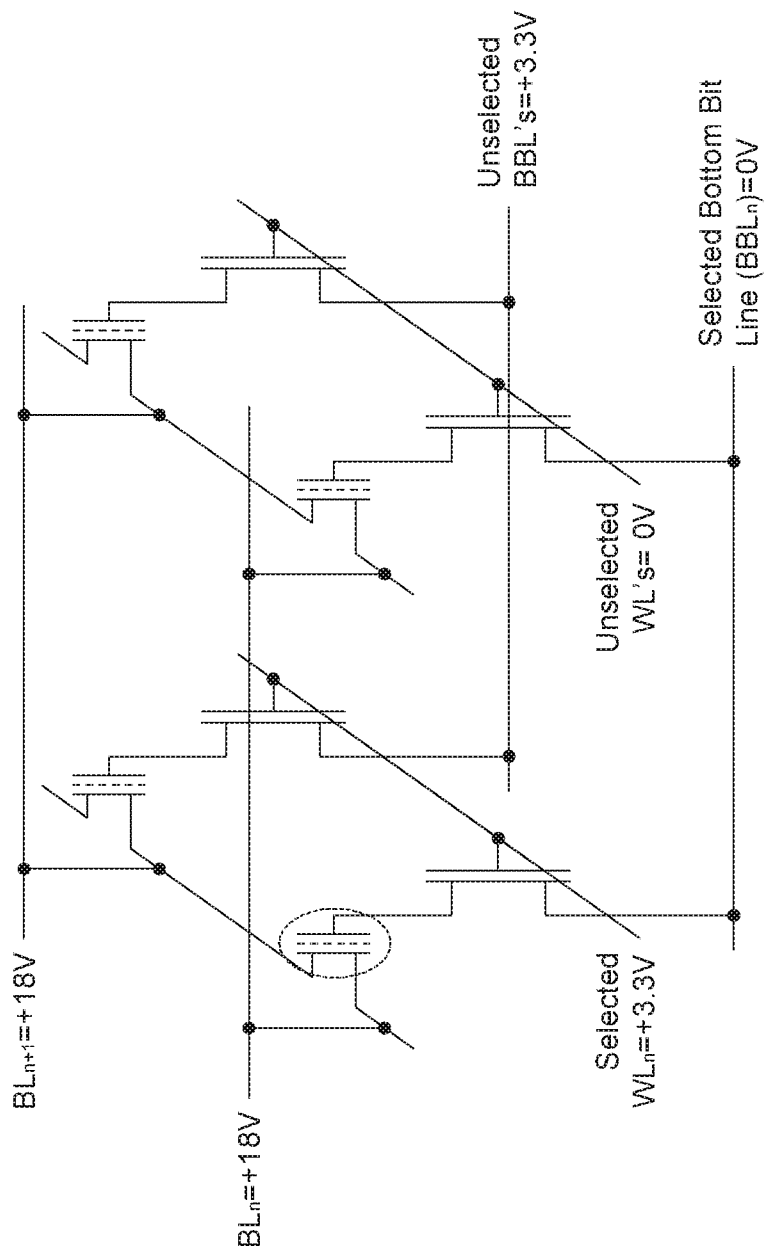
FIG. 2C illustrates the equivalent circuit diagram of the memory device during the erase operation.

As shown in FIG. 2O, to select a memory cell (enclosed by the dotted line in FIG. 2C) for erase, the voltages of all top conductive lines are +18V; the voltage of the corresponding word line (select gate) may be +3.3V, and the voltage of the unselected word lines (select gates) may be 0V; the voltage of the selected bottom conductive line ($BBL_n$) may be 0V, and the voltage of the unselected bottom conductive line (BBL, such as $BBL_{n+1}$) may be +3.3V.

The side semiconductor layer 18 (thin poly gate) of the unselected cell may be floated and self-boosted by the top conductive lines (top bit lines) for erase inhibit. For the selected cell, the side semiconductor layer 18 (thin vertical poly channel) is grounded (0V), thus leading to −FN erasing. For the unselected bottom conductive lines, the side semiconductor layer 18 (thin vertical poly channel) are self-boosted because the select gate is turned-off. For the unselected word lines, the gates are turned-off, thus the side semiconductor layer 18 (thin vertical poly channel) are also self-boosted.

The −FN erasing has a little slower than +FN programming, because the −FN erasing is often slower than +FN programming for SONOS-type charge-trapping device. Byte erasing speed may be ~100 μsec.

According to the read operation, the program operation and the erase operation of the memory device 100, truly random access (bit program/erase) is possible, because the bottom select gate transistor provides a robust array selection. The bottom select gate transistor can be designed with a very long-channel (>0.6 μm) device to sustain high-voltages, without wasting the area.

FIG. 3A to FIG. 3I illustrate a process for manufacturing the memory device 100 in one embodiment according to the disclosure. It should be noted that some elements may be omitted for illustrating the relationship between other elements more clearly.

Figure 3B:
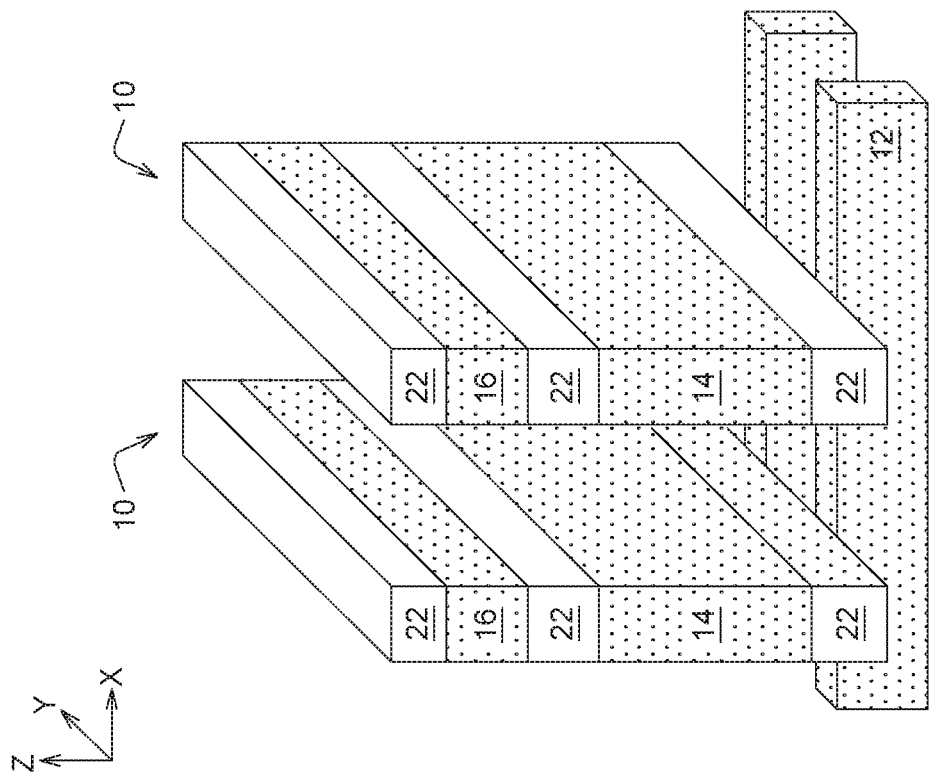
Figure 3A:
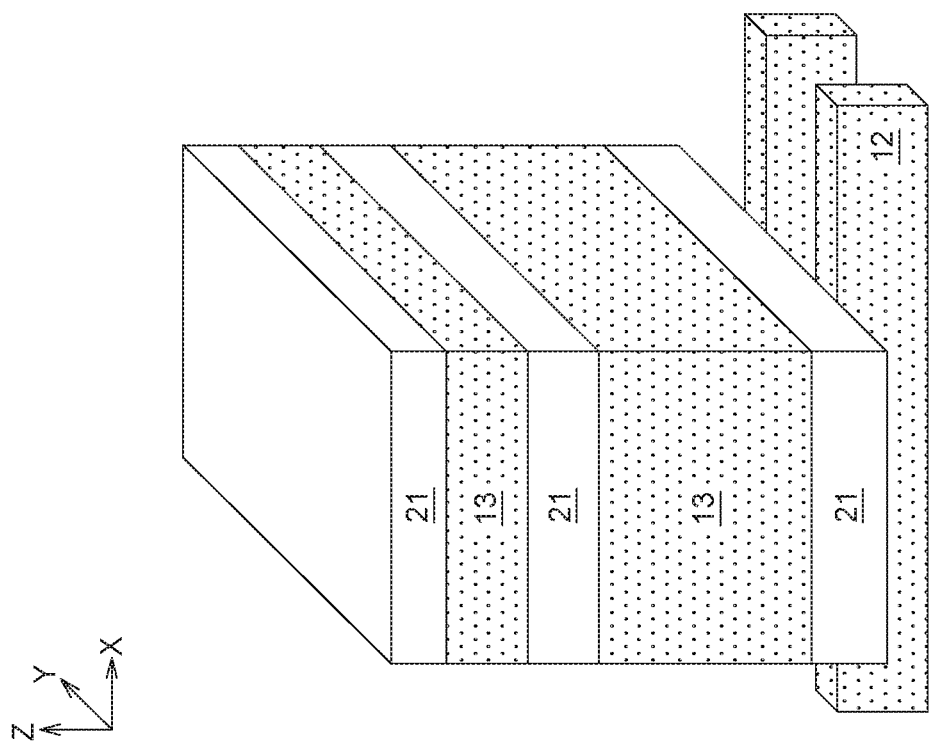

As shown in FIG. 3A, a plurality of bottom conductive lines 12 are formed. Then, a plurality of semiconductor layers 13 and oxide layers 21 are alternately stacked on the conductive lines 12.

As shown in FIG. 3B, the plurality of semiconductor layers 13 and oxide layers 21 is etched, and the etching process may be stopped on the bottom conductive lines 12 to form a plurality of stacked structures 10. In this embodiment, each of the stacked structures 10 may include a first semiconductor layer 14 and a second semiconductor layer 16 disposed above the first semiconductor layer 14. Besides, oxide layers 22 may be alternately stacked with the first semiconductor layer 14 and the second semiconductor layer 16.

As shown in FIG. 3C, oxide layers 23 are formed on side walls of the stacked structures 10. In one embodiment, a thickness of each of the oxide layers 23 may be about 10 nm. Here, the oxide layers 23 may serve as the gate oxide to increase the equivalent oxide thickness (EOT) of a bottom select-gate (SG) cell (formed in the following steps) in order to sustain a high voltage without charging effect.

As shown in FIG. 3D, polymer layers 40 are filled between the stacked structures 10. In one embodiment, the polymer layers 40 may be formed of photoresist-like material.

Then, portions of the polymer layers 40 and the oxide layers 23 on the side walls of the stacked structures 10 are etched, such that side walls of the second semiconductor layer 16 may be exposed as shown in FIG. 3E. That is, a side oxide layer 24 may be formed on both side walls of the first conductive layer 14. Here, an isotropic etching process or a wet etching process may be implemented to etch back the oxide layers 23 on side walls of the second semiconductor layer 16.

As shown in FIG. 3F, the polymer layers 40 are removed. Then, a dielectric layer 28 is formed on the stacked structures 10. In this embodiment, the dielectric layer 28 may be a multi-layer structure including ONO structure.

As shown in FIG. 3G, a side semiconductor layer 18 is formed on the dielectric layer 28. In this embodiment, the side semiconductor layer 18 may be formed by the following steps (now shown). First, semiconductor material is deposited on the stacked structures 10. Here, a thickness of the semiconductor material may be about 5 nm. Then, portions of the dielectric layer 28 and the semiconductor material are etched to separate the stacked structures 10. At last, semiconductor material is deposited again to form the side semiconductor layer 18 electrically connected to the bottom conductive lines 12. Similarly, a thickness of the semiconductor material deposited again may be about 5 nm.

As shown in FIG. 3H, portions of the side semiconductor layer 18, portions of the dielectric layer 28 and portions of the oxide layers 22 may be etched to expose portions of the top surfaces of the second semiconductor layer 16. In this step, the side semiconductor layer 18 (vertical channel) of each bottom select-gate transistor may be isolated. It should be noted that portions of the oxide layers 22 are omitted in FIG. 3H.

Figure 3I:
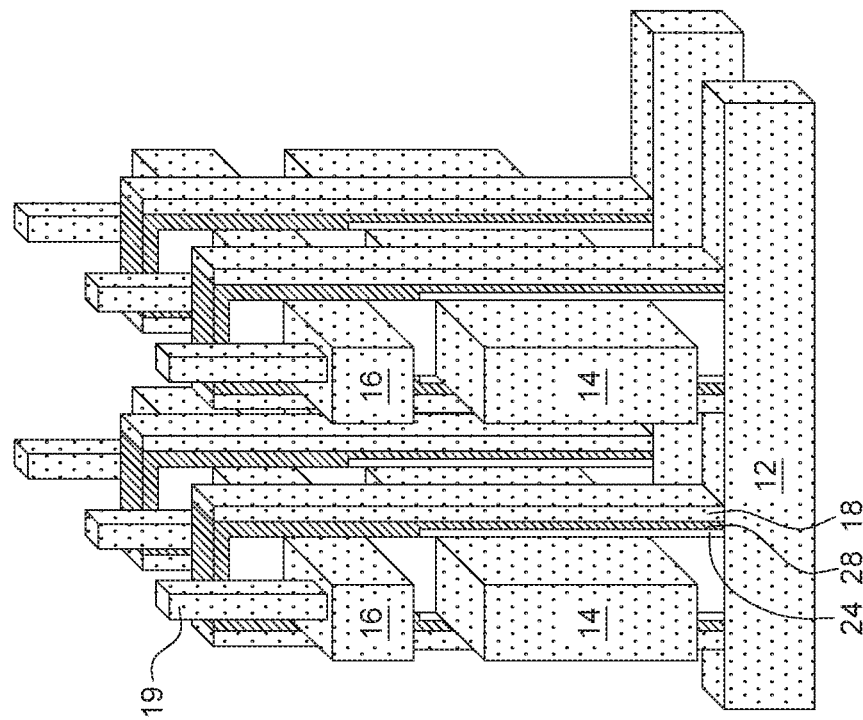
Figure 3I:
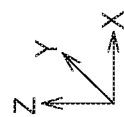

As shown in FIG. 3I, contacts 19 are formed on the exposed portions of the top surfaces of the second semiconductor layer 16. Here, the contacts 19 may be formed with $N^+$ implant to define the source/drain portions 165 (see FIG. 1A).

Then, top conductive lines 30 are formed, and the top conductive lines 30 are electrically connected to one of the contacts 19. As a result, the memory device 100 as shown in FIG. 1A and FIG. 1B may be formed.

Figure 4:
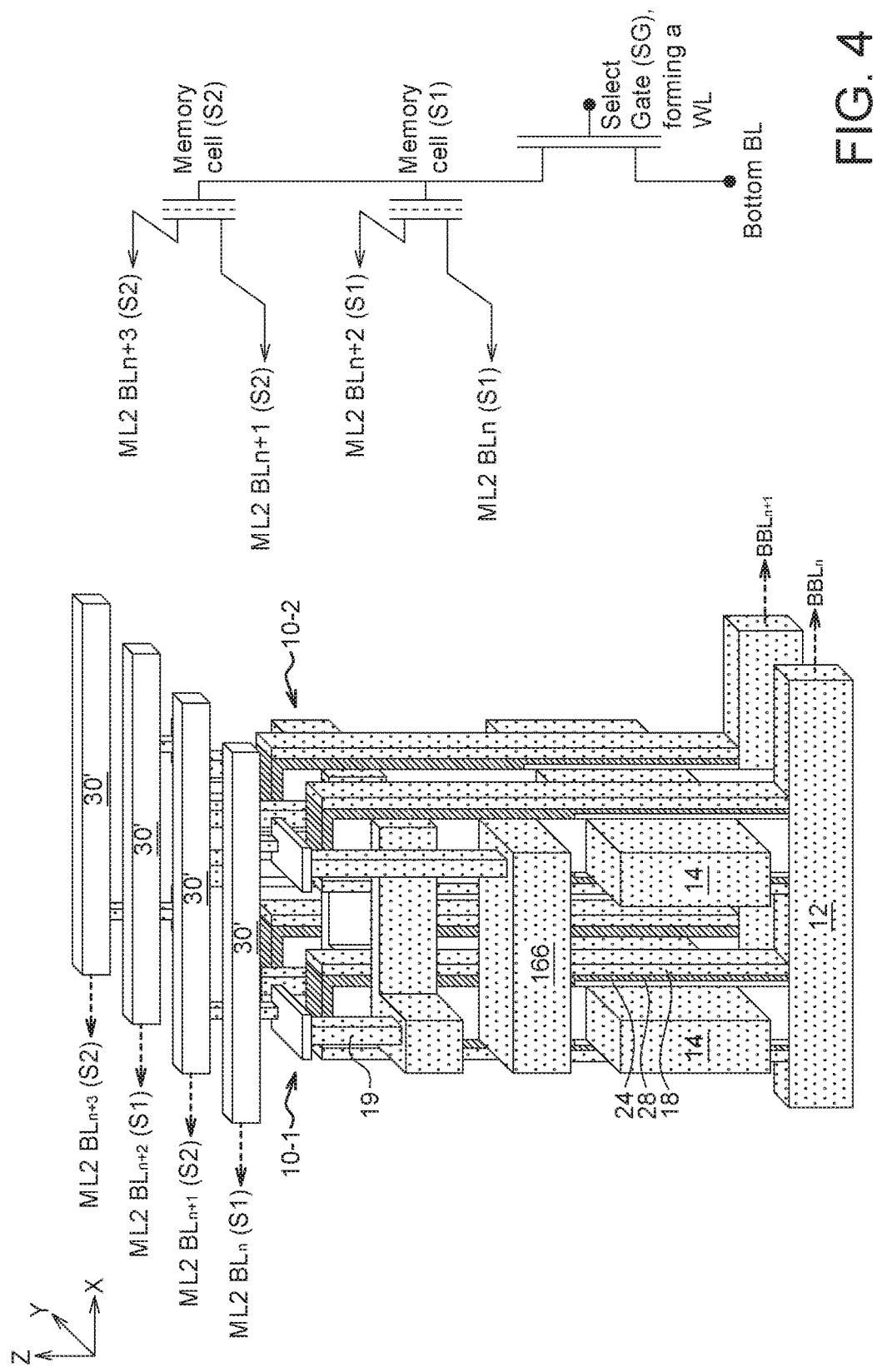
FIG. 4 illustrates a 3D architecture and an equivalent circuit diagram of a memory device in another embodiment according to the disclosure.

The disclosure is not limited to the memory device 100 as shown in FIG. 1A and FIG. 1B. FIG. 4 illustrates a 3D architecture and an equivalent circuit diagram of a memory device 101 in another embodiment according to the disclosure. In this embodiment, the memory device 101 may include a first stacked structure 10-1 and a second stacked structure 10-2, and each of the first stacked structure 10-1 and the second stacked structure 10-2 may include connecting pads 166 disposed between the first stacked structure 10-1 and the second stacked structure 10-2.

As shown in FIG. 4, the connecting pads 166 may connect the second semiconductor layers 16 of the first stacked structure 10-1 to the second semiconductor layers 16 of the second stacked structure 10-2.

Further, the top conductive lines 30', such as top bit lines ML2 $BL_n$ (S1), ML2 $BL_{n+1}$ (S2), ML2 $BL_{n+2}$ (S1), ML2 $BL_{n+3}$ (S2) of the memory device 101, may have double density compared with the top conductive lines 30 of the memory device 100 in FIG. 1A.

Here, the double density of the top conductive lines 30' may be used to decode the two-layer memory cells (memory cell (S1) and memory cell (S2)), and the connecting pads 166 are used to decode the two-layer memory cells' source/drain portions. Further, the vertical channel of the bottom select-gate (SG) transistor may directly serve as the gate that connects the two-layer memory cells.

According to the embodiments described above, a possible design rule that bit line pitch in FIG. 1A may be about 80 nm (or 40 nm half-pitch in FIG. 4), while the word line pitch may be about 80 nm may be achieved.

In some embodiment, the word line pitch may be limited by the thickness of the dielectric layer 28 (about 15 nm) and the thickness of the side semiconductor layer 18 (about 10 nm). Further, the channel length of the memory cell (VG cell) may be around 50 nm. Such a high-density EEPROM can achieve 16 Gb (Single-Level Cell, SLC) density within die size about 100 mm² (peripheral not included) for one-layer design (such as memory device 100 in FIG. 1A). Furthermore, the SLC operation can allow program/erase cycling endurance larger than 100K after device optimizations.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:
    a bottom conductive line;
    a stacked structure disposed on the bottom conductive line, comprising:
        a first semiconductor layer;
        a second semiconductor layer disposed above the first semiconductor layer; and
        a plurality of oxide layers alternately stacked with the first semiconductor layer and the second semiconductor layer;
    a side oxide layer disposed on both side walls of the first semiconductor layer;
    a dielectric layer disposed on the stacked structure; and
    a side semiconductor layer disposed on the dielectric layer.

2. The memory device according to claim 1, further comprising:
    contacts electrically connected to the second semiconductor layer; and
    a top conductive line electrically connected to one of the contacts.

3. The memory device according to claim 2, wherein the top conductive line is disposed parallel with the bottom conductive line.

4. The memory device according to claim 2, wherein the top conductive line is formed of metal, and the bottom conductive line is formed of polysilicon.

5. The memory device according to claim 2, wherein the second semiconductor layer forms source/drain portions, and the contacts are directly in contact with the source/drain portions.

6. The memory device according to claim 1, wherein a conductive type of the bottom conductive line is different from a conductive type of the first semiconductor layer.

7. The memory device according to claim 6, wherein the bottom conductive line is formed of N-type polysilicon, and the first semiconductor layer is formed of P-type polysilicon.

8. The memory device according to claim 1, wherein the side semiconductor layer is formed of undoped polysilicon.

9. The memory device according to claim 1, wherein the dielectric layer is a multi-layer structure including ONO structure.

10. The memory device according to claim 1, wherein a thickness of the side oxide layer is 10 nm.

11. The memory device according to claim 1, wherein the first semiconductor layer, the side oxide layer, the dielectric layer, and the side semiconductor layer define a bottom select-gate transistor.

12. The memory device according to claim 1, wherein the second semiconductor layer, the dielectric layer, and the side semiconductor layer define a top memory cell.

13. The memory device according to claim 1, further comprising:
a plurality of the stacked structures including a first stacked structure and a second stacked structure, each of the first stacked structure and the second stacked structure comprising a plurality of the second semiconductor layers; and
connecting pads disposed between the first stacked structure and the second stacked structure;
wherein the connecting pads connect the second semiconductor layers of the first stacked structure to the second semiconductor layers of the second stacked structure.

* * * * *